(12) United States Patent
Kelly et al.

(10) Patent No.: US 11,059,120 B2
(45) Date of Patent: Jul. 13, 2021

(54) NON-DESTRUCTIVE IDENTIFYING OF PLATING DISSOLUTION IN SOLDERED, PLATED THROUGH-HOLE

(71) Applicant: INTERNATIONAL BUSINESS MACHINES CORPORATION, Armonk, NY (US)

(72) Inventors: Matthew S. Kelly, Oakville (CA); Joseph Kuczynski, North Port, FL (US); Scott B. King, Rochester, MN (US); Bruce J. Chamberlin, Vestal, NY (US); Matthew Doyle, Chatfield, MN (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 247 days.

(21) Appl. No.: 16/177,565

(22) Filed: Nov. 1, 2018

(65) Prior Publication Data
US 2020/0139466 A1  May 7, 2020

(51) Int. Cl.
*B23K 3/08* (2006.01)
*H05K 3/34* (2006.01)
*B23K 1/00* (2006.01)
*B23K 101/42* (2006.01)

(52) U.S. Cl.
CPC .............. *B23K 3/08* (2013.01); *B23K 1/0016* (2013.01); *H05K 3/3447* (2013.01); *B23K 2101/42* (2018.08); *H05K 2203/044* (2013.01); *H05K 2203/045* (2013.01); *H05K 2203/0455* (2013.01); *H05K 2203/163* (2013.01)

(58) Field of Classification Search
None
See application file for complete search history.

(56) References Cited

U.S. PATENT DOCUMENTS

| | | | |
|---|---|---|---|
| 6,168,065 B1 * | 1/2001 | Willemen | B23K 1/018 228/9 |
| 6,688,511 B2 * | 2/2004 | Hildenbrand | B23K 1/085 228/102 |
| 6,950,761 B2 | 9/2005 | Ramanujachar | |

(Continued)

OTHER PUBLICATIONS

Hamilton et al., "Copper Dissolution Through-hole Solder Joint Reliability", Materials Science, 2009, p. 1-11 (Year: 2009).*

(Continued)

*Primary Examiner* — Devang R Patel
(74) *Attorney, Agent, or Firm* — Tihon Poltavets, Esq.; Kevin P. Radigan, Esq.; Heslin Rothenberg Farley & Mesiti P.C.

(57) ABSTRACT

Fabrication of a reliable circuit board assembly with soldered, plated through-hole structures is facilitated by characterizing plating of a plated through-hole of the circuit board using time-domain reflectance to obtain a base reflectance measurement, and applying solder to the plated through-hole. Based on applying the solder, the plating of the plated through-hole of the circuit board is re-characterized using time-domain reflectance to obtain a new reflectance value. Based on a deviation between the new reflectance measurement and the base reflectance measurement exceeding a threshold, dissolution, at least in part, of the plating of the plated through-hole due to applying the solder is identified.

11 Claims, 8 Drawing Sheets

(56) References Cited

U.S. PATENT DOCUMENTS

| | | | |
|---|---|---|---|
| 8,140,277 B2* | 3/2012 | McElfresh | G01R 31/2853 702/58 |
| 8,531,202 B2 | 9/2013 | Mok et al. | |
| 9,013,204 B2 | 4/2015 | Liu et al. | |
| 2014/0353018 A1* | 12/2014 | Soeda | H05K 3/4614 174/257 |
| 2015/0015269 A1 | 1/2015 | Schulze et al. | |
| 2018/0203055 A1 | 7/2018 | Kwon et al. | |

OTHER PUBLICATIONS

Hamilton et al., "A Study of Copper Dissolution During Lead Free PTH Rework Using a Thermally Massive Test Vehicle", IBM Corporation, SMTAi, (Jul. 13, 2006) (6 pages).

Hamilton et al., "Have High Cu Dissolution Rates of SAC305/405 Alloys Forced a Change in the Lead Free Alloy Used During PTH Processes?", IBM Corporation, PanPac (2007) (9 pages).

Kwon et al., "Detection of Solder Joint Degradation Using RF Impedance Analysis", Center for Advanced Lyfe Cycle Engineering (CALCE), IEEE Electronic Components and Technology Conference (2008) (pp. 606-610).

Kim, Seung-Il, "Damage Detection of Sandwich Structure Using Time Domain Reflectometry", Advanced Materials Research, vol. 123 (Aug. 11, 2010) (pp. 891-894).

Wu et al., "Experimental Location of Damage in Microelectronic Solder Joints After a Board Level Reliability Evaluation", Engineering Failure Analysis, vol. 83 (2018) (pp. 131-140).

Mel, et al., "The NIST Definition of Cloud Computing," National Institute of Standards and Technology, Information Technology Laboratory, Special Publication 800-145, Sep. 2011 (p. 1-7).

IBM Publication, "Power ISA™ Version 2.07B," Apr. 9, 2015, (pp. 1-1527).

IBM Publication, "z/Architecture Principles of Operation," IBM® Publication No. SA22-7832-11, 12th Edition, Sep. 2017, (pp. 1-1902).

* cited by examiner

NON-DESTRUCTIVE IDENTIFYING OF PLATING DISSOLUTION IN SOLDERED, PLATED THROUGH-HOLE

BACKGROUND

Circuit boards, such as printed circuit boards, or wiring boards, are used in a wide variety of electronic products. A circuit board mechanically supports and electrically connects electronic components and/or electrical components using conductive lines, pads, and other features on or within one or more layers of the circuit board. In circuit board design, a through-hole extends through the circuit board, and can include, for instance, pads in appropriate positions on different layers of the board that are electrically connected by, for instance, a plating of the through-hole within the board. For instance, a through-hole can be made, in one or more embodiments, conductive by electroplating.

Traditionally, should a plated through-hole problem arise or be detected post manufacture of one or more circuit board assemblies, reworking the board(s) can be difficult, and the board(s) may need to be discarded.

SUMMARY

Certain shortcomings of the prior art are overcome and additional advantages are provided through the provision of a method of facilitating fabricating a circuit board assembly. The method includes: characterizing a plating of a plated through-hole of a circuit board using time-domain reflectance to obtain a base reflectance measurement, and applying solder to the plated through-hole. Based on applying the solder, the method further includes re-characterizing the plating of the plated through-hole of the circuit board using time-domain reflectance to obtain a new reflectance measurement. Based on a deviation between the new reflectance measurement and the base reflectance measurement exceeding a threshold, the method includes identifying dissolution, at least in part, of the plating of the plated through-hole due to the applying of the solder.

Systems and computer program products relating to one or more aspects are also described and claimed herein.

Additional features and advantages are realized through the techniques of the present invention. Other embodiments and aspects of the invention are described in detail herein and are considered a part of the claimed invention.

BRIEF DESCRIPTION OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Figure 1:
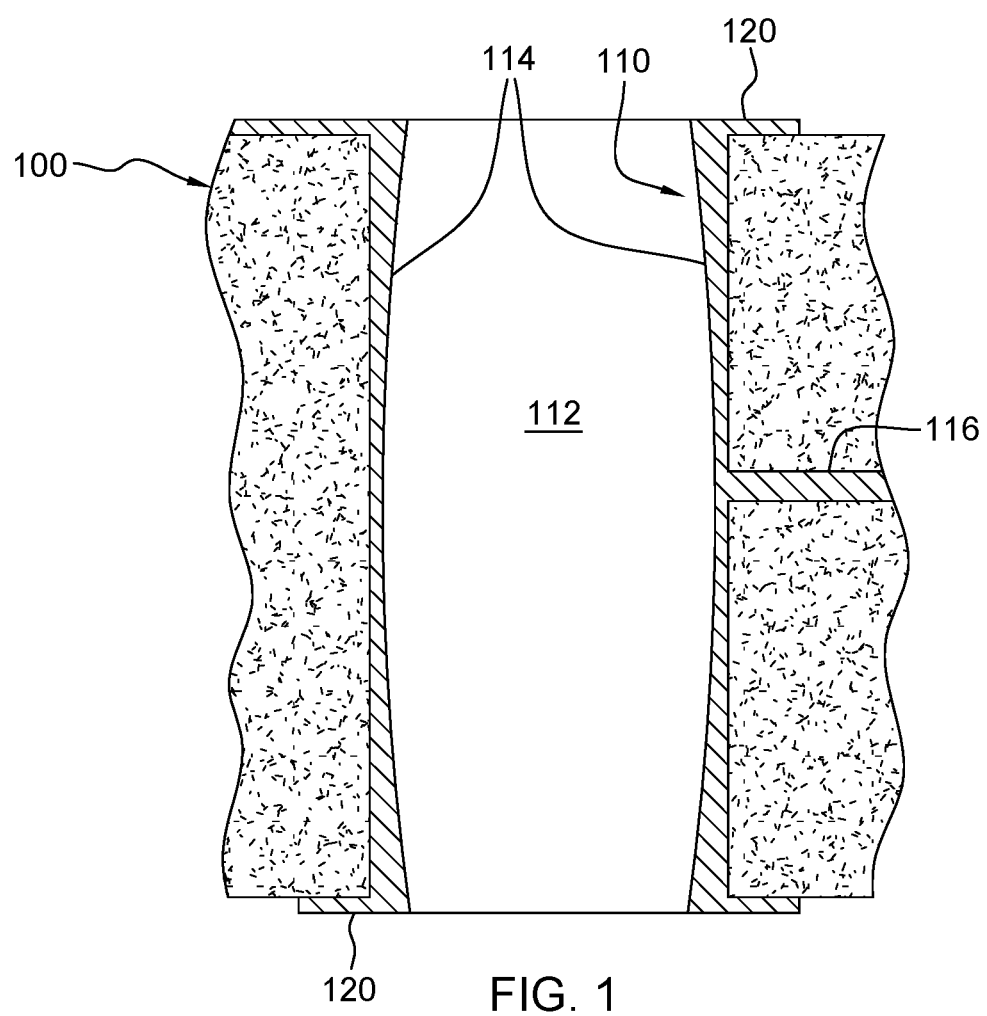
FIG. 1 depicts a partial cross-sectional elevational view of one embodiment of a circuit board with a plated through-hole obtained as part of a circuit board assembly fabrication process, in accordance with one or more aspects of the present invention.

Aspects of the present invention and certain features, advantages and details thereof, are explained more fully below with reference to the non-limiting example(s) illustrated in the accompanying drawings. Descriptions of well-known systems, devices, processing techniques, etc., are omitted so as to not unnecessarily obscure the invention in detail. It should be understood, however, that the detailed description and the specific example(s), while indicating aspects of the invention, are given by way of illustration only, and not by way of limitation. Various substitutions, modifications, additions, and/or other arrangements, within the spirit and/or scope of the underlying inventive concepts will be apparent to those skilled in the art from this disclosure. Note further that numerous inventive aspects and features are disclosed herein, and unless inconsistent, each disclosed aspect or feature is combinable with any other disclosed aspect or feature as desired for a particular application of fabricating a circuit board assembly using, in part, time-domain reflectance evaluation of soldered, plated through-holes, and based thereon, identification of plating dissolution, such as disclosed herein.

The illustrative embodiments are described below using specific designs, architectures, protocols, layouts, schematics, or tools only as examples, and are not limited to the illustrative embodiments. Furthermore, the illustrative embodiments may be described in certain instances using particular tools, and processing environments only as example for clarity of description. The illustrative embodiments can be used in conjunction with other comparable or similarly purposed structures, systems, applications, or architectures.

The examples in this disclosure are used only for clarity of description and are not limiting to the illustrative embodiments. Additional operations, actions, tasks, activities, and manipulations will be conceivable from this disclosure and the same are contemplated within the scope of the illustrative embodiments.

Any advantages listed herein are only examples and are not intended to be limiting to the illustrative embodiments. Additional or different advantages can be realized by specific illustrative embodiments. Furthermore, a particular illustrative embodiment can have some, all, or none of the advantages listed herein.

As noted, reworking a circuit board, such as a printed circuit board, wiring board, etc., is difficult post manufacture should a problem be detected or arise, such as with a plated through-hole of the circuit board. In certain circuit board designs, solder is applied to one or more plated through-holes, for instance, to establish one or more pin-through-hole interconnects. Today, pin-through-hole reliability defects can occur during soldering of components due, for instance, to plating dissolution by the solder, that is, dissolution of the annular ring of plating material within the circuit board through-hole. By way of example, where the plating is, or includes, copper, the copper can undergo dissolution (at least in part) within the liquid solder. This process can be difficult to detect visually or via x-ray analysis due to the limited contrast between copper plating and solder, and because any dissolution typically begins at an edge or knee, where the plating leaves the through-hole, and then migrates towards the board's surface at the contact pad. Presently, the only approach to detecting this type of defect is through a destructive cross-sectioning of the circuit board assembly through the pin-through-hole interconnect. Material selection and adherence to strict process boundaries can be used to minimize plating dissolution, but no process is 100% infallible. Consequently, a non-destructive approach to evaluating plating dissolution due to solder such as disclosed herein would be particularly advantageous.

By way of example, FIG. 1 depicts one embodiment of a plated through-hole 110 within a circuit board 100. As illustrated, plated through-hole 110 can include a through-hole 112, formed within circuit board 100, which has been plated 114, such as by electroplating, with a conductive material, such as a metal (e.g., copper). In one or more implementations, FIG. 1 depicts one example of a high resolution through-hole, where the resolution of the through-hole is defined by the board thickness divided by the through-hole diameter. In high resolution through-holes today, a barreling effect can occur (as shown) where the electroplated through-hole wall bows slightly outward in the middle. This bowing of the through-hole wall can be intrinsic to the plating process. As also shown in FIG. 1, circuit board 100 can have one or more power or signal planes 116 centrally disposed within the circuit board and electrically connected to plated through-hole 110, as well as one or more annular rings or contact pads 120, such as at the opposite surfaces of the circuit board.

Figure 2:
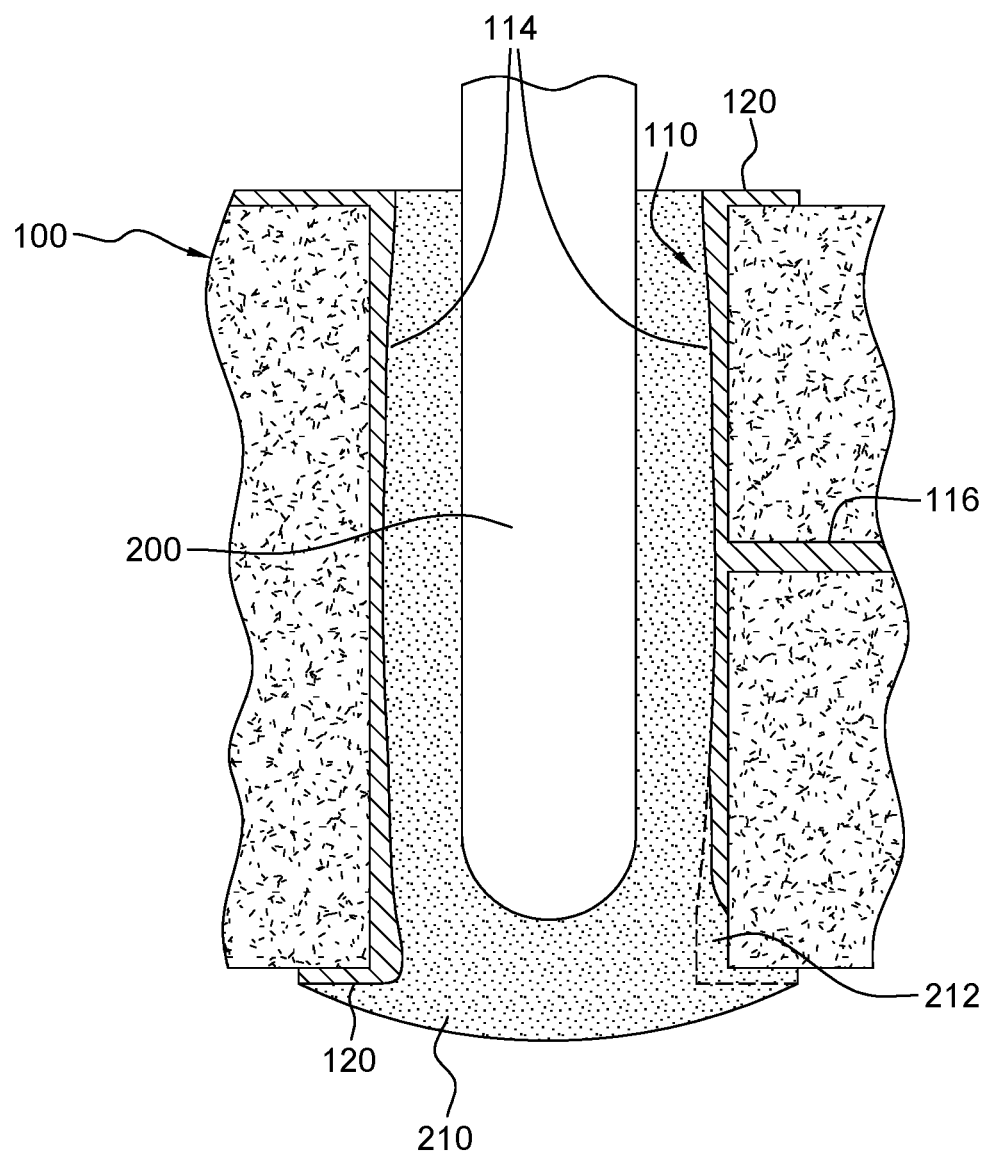
FIG. 2 depicts the circuit board and plated through-hole of FIG. 1, after inserting a pin and applying solder to the plated through-hole, and after partial dissolution of the plating, which is to be identified, in accordance with one or more aspects of the present invention.

FIG. 2 depicts the plated through-hole 110 and circuit board 100 embodiment of FIG. 1, with a pin-through-hole interconnection formed by a pin 200 having been inserted into the plated through-hole, and solder 210 applied within the through-hole. For instance, in one or more embodiments, an automated assembly process could be provided to fabricate a circuit board assembly which includes, in part, inserting pin 200 into plated through-hole 110 and soldering 210, for instance, by wave soldering, the pin-through-hole interconnection to provide good electrical contact.

FIG. 2 also depicts an example of plating dissolution which is to be identified, in accordance with one or more aspects of the present invention. A shown, plating 114 of plated through-hole 110 has dissolved into solder 210 in region 212 during, or as a result of, the soldering operation. Disclosed herein is a non-destructive process to detect this plating dissolution, and which can be integrated within the circuit board assembly fabrication process. Advantageously, non-destructive testing for plating dissolution will assist in reducing or eliminating thermo-mechanical reliability risks with circuit board assemblies having soldered, plated through-holes. The processing disclosed herein enables non-destructive testing of the circuit board during the fabrication process. Should plating dissolution occur unknowingly, then the circuit board could be subject to earlier life solder joint failure(s), which can be accelerated if the plated through-hole joint is under a mechanical load, whether static or dynamic.

Figure 3:
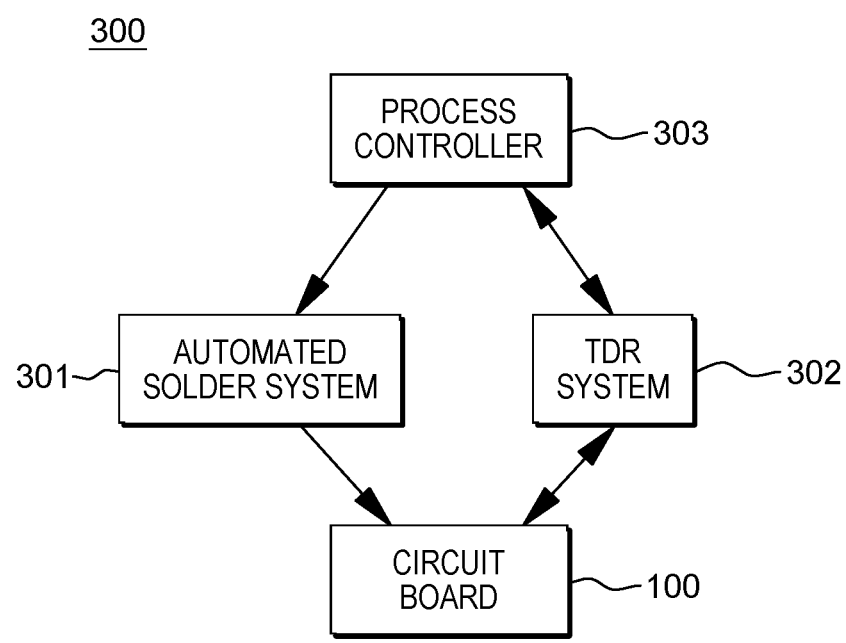
FIG. 3 depicts a partial embodiment of a system for fabricating a circuit board assembly, which is capable of identifying dissolution, at least in part, of the plating of a soldered, plated through-hole, in accordance with one or more aspects of the present invention.

As noted, time-domain reflectance-based processing is disclosed herein to facilitate detecting plating dissolution in a non-destructive manner. FIG. 3 depicts one partial embodiment of a system for fabricating a circuit board assembly 100, in accordance with one or more aspects of the present invention. As illustrated, system 300 includes an automated soldering system 301 (such as a wave soldering system), a time-domain reflectance (TDR) system 302, and a process controller 303 which controls, in part, automated soldering system 301 and TDR system 302 to facilitate fabricating circuit board 100, as described herein. Advantageously, there is an order of magnitude difference in resistivity between copper and solder, with the exact values varying with the type of copper and solder content of the plating and soldering material. A TDR pulse can be used to detect a change in reflectivity as the pulse travels along the skin of the plating of the plated through-hole. If the plating is dissolved, then the reflection coefficient will be altered, and this alteration can be detected by the time-domain reflectance system.

As described herein, the time-domain reflectance (TDR) response of the plating within the plated through-hole in question can be measured prior to soldering or in situ during the soldering operation. For instance, a high-frequency pulse is sent down the plating (e.g., copper) from probes positioned on the contact pad (e.g., copper pad) on one side of the circuit board, and the reflectance response is measured. As plating begins to dissolve during the soldering operation, the reflection pulse is altered, and this alteration can be correlated beforehand to the degree of dissolution which, in turn, can be used to determine the severity of the current dissolution. Depending on the degree to which the plating (e.g., copper) has dissolved, a pass/fail decision can be made for the resultant pin-through-hole interconnect structure.

Figure 4A:
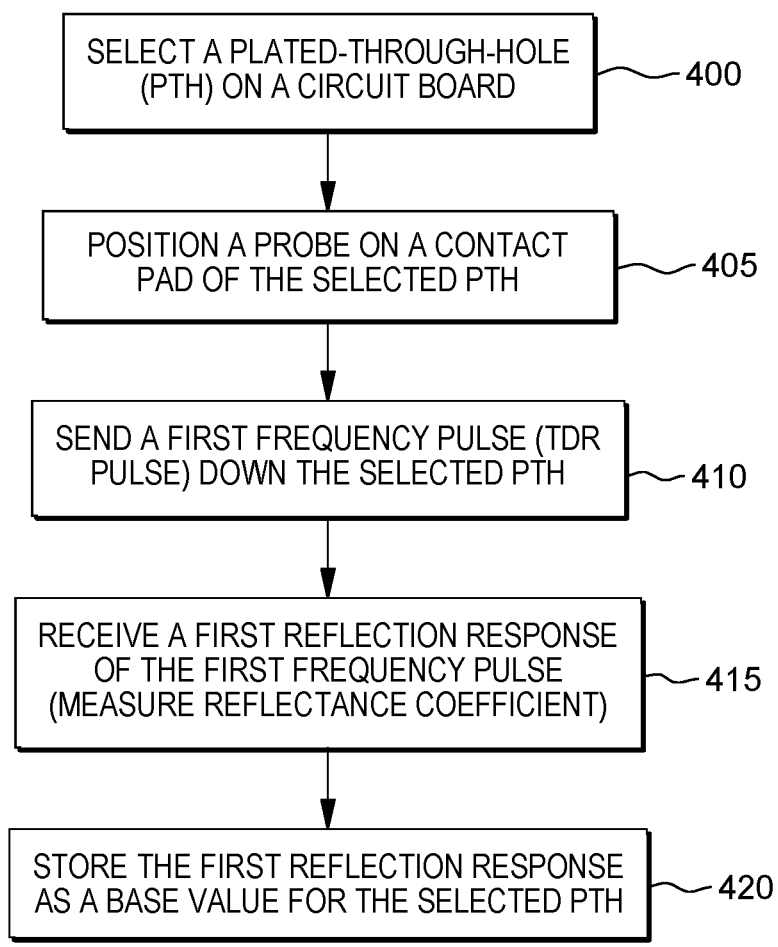
FIG. 4A depicts one embodiment of a process for characterizing the plating of a plated through-hole of a circuit board using time domain reflectance to obtain a base reflectance measurement, in accordance with one or more aspects of the present invention.
Figure 4B:
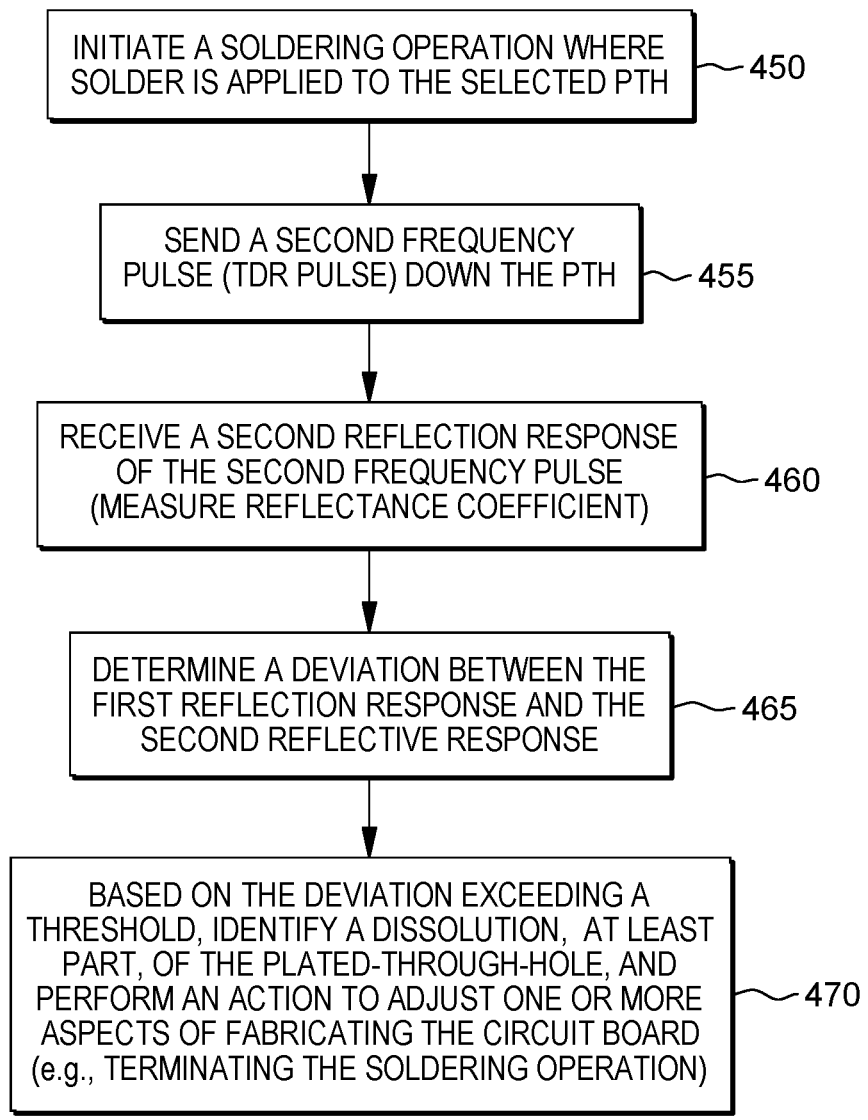
FIG. 4B depicts one embodiment of a process of applying solder to a plated through-hole, re-characterizing the plating of the plated through-hole using time domain reflectance to obtain a new reflectance measurement, and based thereon, identifying whether the plating has dissolved beyond an acceptance threshold due to the solder, in accordance with one or more aspects of the present invention.

By way of example, FIGS. 4A & 4B depict one embodiment of processing in accordance with one or more aspects of the present invention. By way of example, FIG. 4A depicts one embodiment of a process for characterizing a plated through-hole of a circuit board using time-domain reflectance, and FIG. 4B depicts one embodiment of a process for applying solder to the plated through-hole, re-characterizing the plated through-hole using time-domain reflectance, and determining whether plating of the plated through-hole has dissolved into the solder as a result of the soldering operation.

Referring to FIG. 4A, the process includes selecting a plated through-hole (PTH) on a circuit board 400 to be processed. A probe is positioned on a contact pad of the selected PTH 405, and a first frequency pulse (TDR pulse) is sent down the plating of the selected PTH 410. A first reflection response (measured reflection coefficient) of the first frequency pulse is received back 415. This first reflection response can be stored as a base reflectance measurement for the selected PTH 420.

As shown in FIG. 4B, a soldering operation is initiated where solder is applied to the selected PTH 450. During the soldering operation, or subsequent thereto, a second frequency pulse (TDR pulse) is sent down the plating of the PTH 455, and a second reflection response is received (i.e., measured reflectance coefficient) of the second frequency pulse at the probe 460. The control process can then determine whether there is a deviation between the base reflectance measurement (first reflection response) and the new reflectance measurement (second reflection response) 465. Based on the deviation exceeding a defined threshold, processing can identify dissolution, at least in part, of the plating of the plated through-hole due to the solder, and based thereon, can perform an action to adjust fabrication of the circuit board 470. For instance, the action can include terminating the soldering operation in order to make one or more adjustments to the soldering process, and/or plating process of the plated through-holes to address the dissolution issue.

The processing disclosed herein can be generalized to sending a TDR pulse down the plating of the plated through-hole, and measuring a reflectance coefficient. Processing can determine whether the measured reflectance coefficient is within an acceptable value based upon one or more predetermined values, which can be obtained prior to the fabrication process. For instance, plated through-holes within circuit boards can be tested to ascertain measured reflectance coefficients for different degrees of plating dissolution into the solder. If the reflectance coefficient is not within acceptable values, then plating dissolution is likely. Otherwise, the process can continue by repeating sending a TDR pulse down the plating of the plated through-hole. Note that this testing can occur for a number of plated through-holes in the circuit board, or even, if desired, for all of the plated through-holes in a circuit board to receive solder.

Exemplary embodiments of computing environments which may implement one or more aspects of the present invention are described below with reference to FIGS. 5-7.

Figure 5:
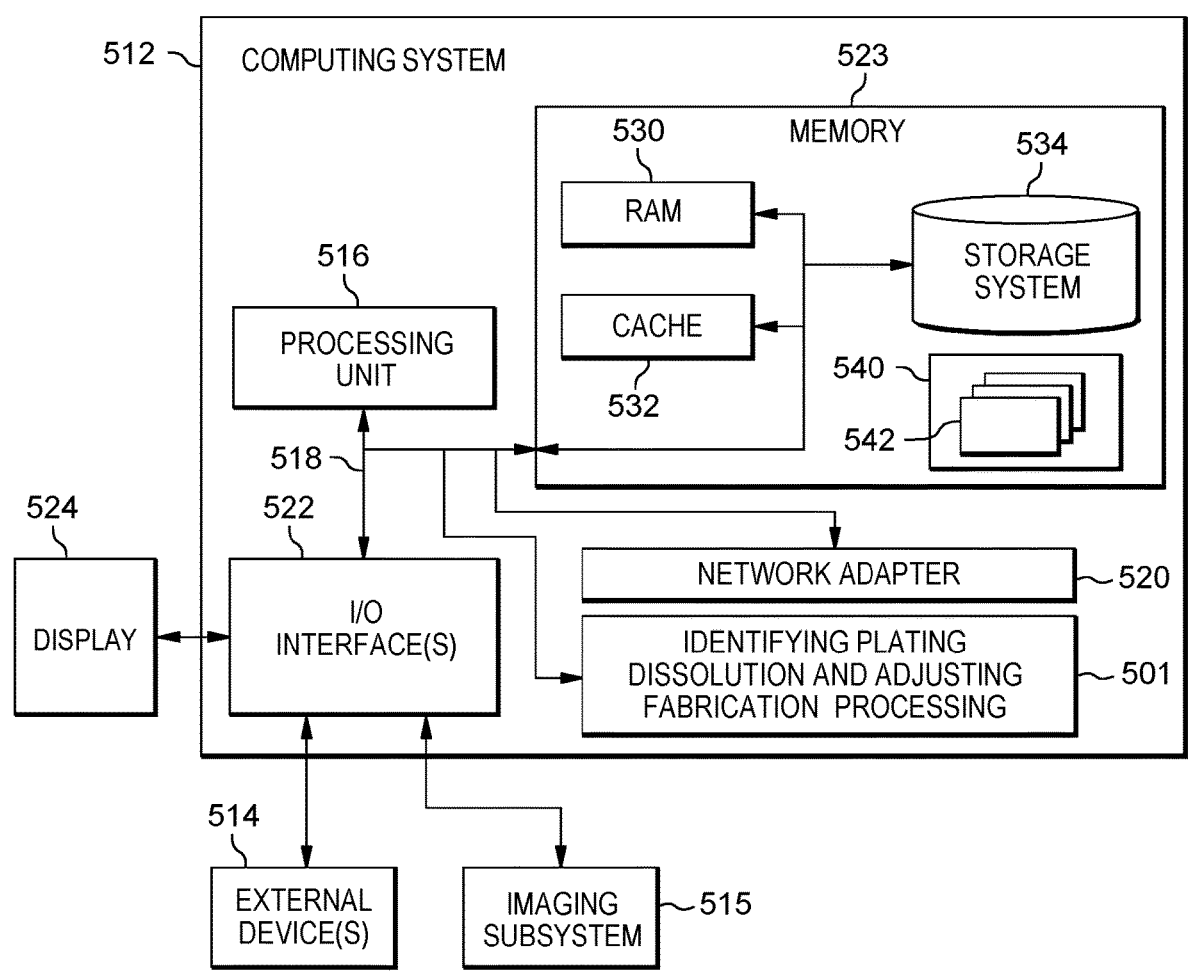
FIG. 5 depicts one embodiment of a computing system which can implement or facilitate implementing one or more aspects of facilitating circuit board assembly fabrication, in accordance with one or more aspects of the present invention.

By way of example, FIG. 5 depicts one embodiment of a computing environment 500, which includes a computing system 512. Examples of well-known computing systems, environments, and/or configurations that may be suitable for use with computer system 512 include, but are not limited to, a server, a desktop computer, a work station, a mobile device, such as a wireless computer, a handheld or laptop computer or device, a mobile phone, a programmable consumer electronic device, a tablet, a personal digital assistant (PDA), or the like.

Computing system 512 may be described in the general context of computer system-executable instructions, such as program modules, being executed by a computer system. Generally, program modules may include routines, programs, objects, components, logic, data structures, and so on that perform particular tasks or implement particular abstract data types.

As depicted in FIG. 5, computing system 512, is shown in the form of a general-purpose computing device. The components of computing system 512 may include, but are not limited to, one or more processors or processing units 516, a system memory 523, and a bus 518 that couples various system components including system memory 523 to processing unit 516.

In one embodiment, processing unit 516 may be based on the z/Architecture® offered by International Business Machines Corporation, or other architectures offered by International Business Machines Corporation or other companies. z/Architecture® is a registered trademark of International Business Machines Corporation, Armonk, N.Y., USA. One embodiment of the z/Architecture® is described in "z/Architecture Principles of Operation," IBM® Publication No. SA22-7832-11, $12^{th}$ edition, September 2017, which is hereby incorporated herein by reference in its entirety.

In other examples, it may be based on other architectures, such as the Power Architecture offered by International Business Machines Corporation. One embodiment of the Power Architecture is described in "Power ISA™ Version 2.07B," International Business Machines Corporation, Apr. 9, 2015, which is hereby incorporated herein by reference in its entirety. POWER ARCHITECTURE® is a registered trademark of International Business Machines Corporation, Armonk, N.Y., USA. Other names used herein may be registered trademarks, trademarks, or product names of International Business Machines Corporation or other companies.

Bus 518 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus.

Computing system 512 can include a variety of computer system readable media. Such media can be any available media that is accessible by computing system 512, and it includes both volatile and non-volatile media, removable and non-removable media.

System memory 523 can include computer system readable media in the form of volatile memory, such as random access memory (RAM) 530 and/or cache memory 532. Computing system 512 may further include other removable/non-removable, volatile/non-volatile computer system storage media. By way of example only, storage system 534 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media could be provided. In such instances, each can be connected to bus 518 by one or more data media interfaces. As described below, memory 523 may include at least one program product having a set (e.g., at least one) of program modules that are configured to carry out various functions of embodiments of the invention.

Program/utility 540, having a set (at least one) of program modules 542, may be stored in memory 523 by way of example, and not limitation, as well as an operating system, one or more application programs, other program modules, and program data. Each of the operating system, one or more application programs, other program modules, and program data or some combination thereof, may include an implementation of a networking environment. Program modules 542 generally carry out various functions and/or methodologies of embodiments of the invention as described herein. Alternatively, or additionally, an identifying plating dissolution and adjusting fabrication processing module, logic, etc., 501 can be provided within computing environment 512.

Computing system 512 can also communicate with one or more external devices 514 such as an imaging subsystem 515, a keyboard, a pointing device, a display 524, etc.; one or more devices that enable a user to interact with computing system 512; and/or any devices (e.g., network card, modem, etc.) that enable computing system 512 to communicate with one or more other computing devices. Such communication can occur via Input/Output (I/O) interfaces 522. Still yet, computing system 512 can communicate with one or more networks such as a local area network (LAN), a general wide area network (WAN), and/or a public network (e.g., the Internet) via network adapter 520. As depicted, network adapter 520 communicates with the other components of computing system, 512, via bus 518. It should be understood that although not shown, other hardware and/or software components could be used in conjunction with computing system 512. Examples, include, but are not limited to: microcode, device drivers, redundant processing units, external disk drive arrays, RAID systems, tape drives, and data archival storage systems, etc.

In one example, the components may include a control engine used in controlling the process aspects disclosed herein, for instance, within a test system, and an evaluation engine for determining a cause for a connection failure, and initiating adjustment of one or more manufacturing processes for the circuit board and/or press-fit connector to correct the determined cause(s) of the connection failure. The components executed by a processor can be individual components or combined in one component. Further, other components can be included to perform one or more other tasks. Many variations are possible.

One or more aspects may relate to or use cloud computing.

It is understood in advance that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g. networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based email). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure comprising a network of interconnected nodes.

Figure 6:
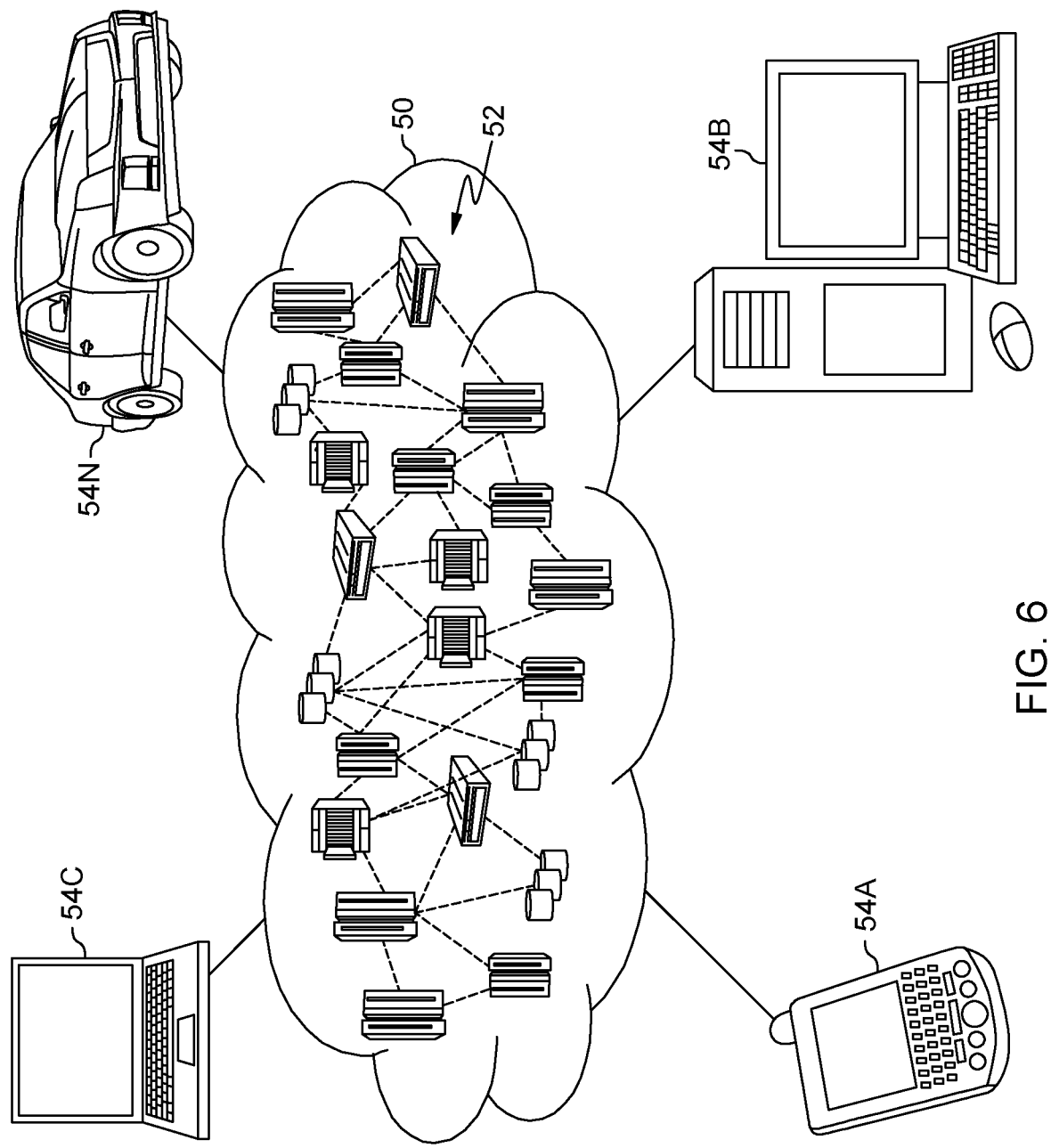
FIG. 6 depicts one embodiment of a cloud computing environment, which can implement, or be used in association with one or more aspects of the present invention.

Referring now to FIG. 6, illustrative cloud computing environment 50 is depicted. As shown, cloud computing environment 50 comprises one or more cloud computing nodes 52 with which local computing devices used by cloud consumers, such as, for example, personal digital assistant (PDA) or cellular telephone 54A, desktop computer 54B, laptop computer 54C, and/or automobile computer system 54N may communicate. Nodes 52 may communicate with one another. They may be grouped (not shown) physically or virtually, in one or more networks, such as Private, Community, Public, or Hybrid clouds as described hereinabove, or a combination thereof. This allows cloud computing environment 50 to offer infrastructure, platforms and/or software as services for which a cloud consumer does not need to maintain resources on a local computing device. It is understood that the types of computing devices 54A-N shown in FIG. 7 are intended to be illustrative only and that computing nodes 52 and cloud computing environment 50 can communicate with any type of computerized device over any type of network and/or network addressable connection (e.g., using a web browser).

Figure 7:
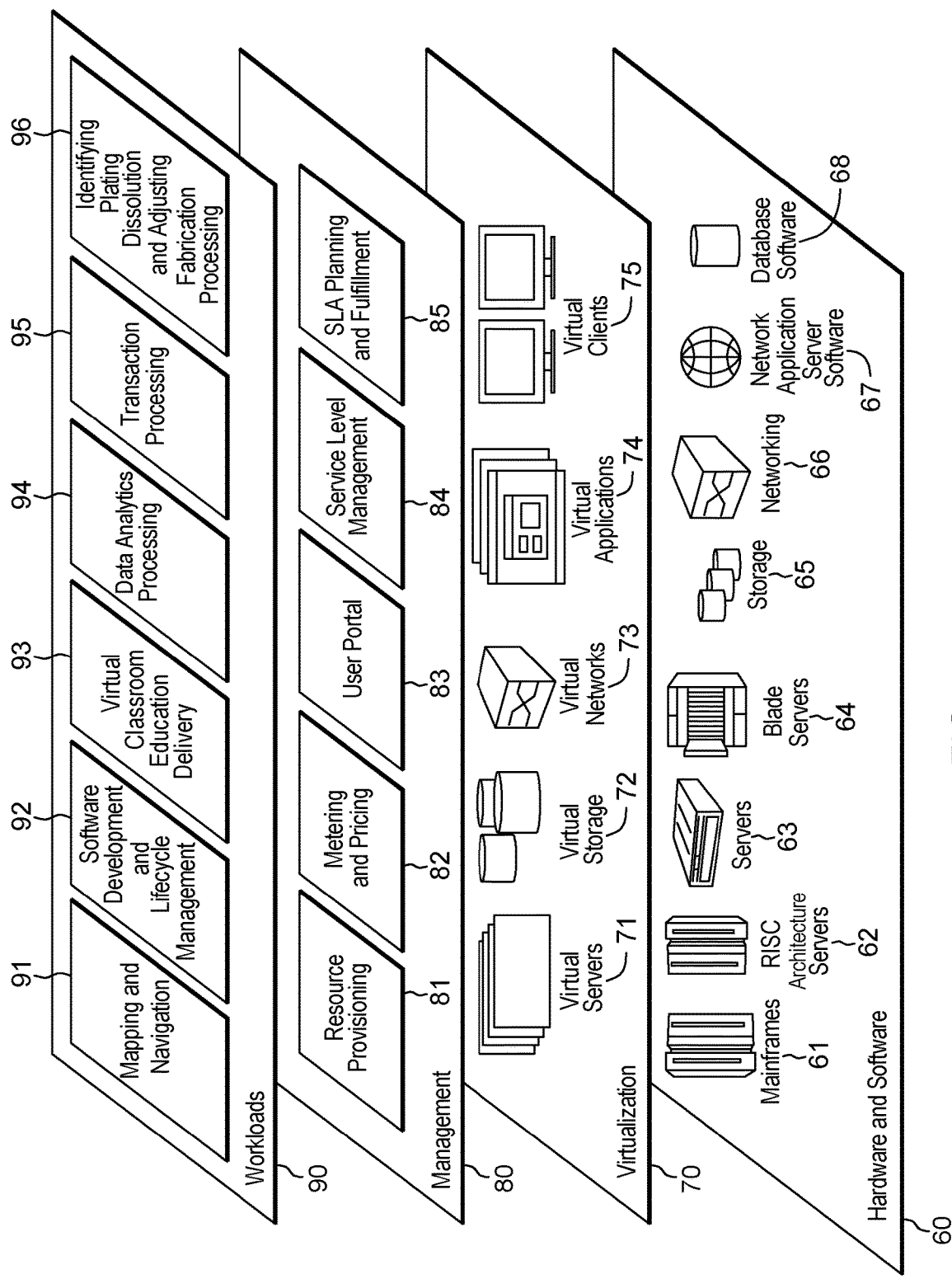
FIG. 7 depicts one example of abstraction model layers, which can facilitate or implement one or more aspects of identifying plating dissolution, and performing an action to adjust circuit board fabrication based thereon, in accordance with one or more aspects of the present invention.

Referring now to FIG. 7, a set of functional abstraction layers provided by cloud computing environment 50 (FIG. 6) is shown. It should be understood in advance that the components, layers, and functions shown in FIG. 7 are intended to be illustrative only and embodiments of the invention are not limited thereto. As depicted, the following layers and corresponding functions are provided.

Hardware and software layer 60 includes hardware and software components. Examples of hardware components include mainframes 61; RISC (Reduced Instruction Set Computer) architecture based servers 62; servers 63; blade servers 64; storage devices 65; and networks and networking components 66. In some embodiments, software components include network application server software 67 and database software 68.

Virtualization layer 70 provides an abstraction layer from which the following examples of virtual entities may be provided: virtual servers 71; virtual storage 72; virtual networks 73, including virtual private networks; virtual applications and operating systems 74; and virtual clients 75.

In one example, management layer 80 may provide the functions described below. Resource provisioning 81 provides dynamic procurement of computing resources and other resources that are utilized to perform tasks within the cloud computing environment. Metering and Pricing 82 provide cost tracking as resources are utilized within the cloud computing environment, and billing or invoicing for consumption of these resources. In one example, these resources may comprise application software licenses. Security provides identity verification for cloud consumers and tasks, as well as protection for data and other resources. User portal 83 provides access to the cloud computing environment for consumers and system administrators. Service level management 84 provides cloud computing resource allocation and management such that required service levels are met. Service Level Agreement (SLA) planning and fulfillment 85 provide pre-arrangement for, and procurement of, cloud computing resources for which a future requirement is anticipated in accordance with an SLA.

Workloads layer 90 provides examples of functionality for which the cloud computing environment may be utilized. Examples of workloads and functions which may be provided from this layer include: mapping and navigation 91; software development and lifecycle management 92; virtual classroom education delivery 93; data analytics processing 94; transaction processing 95; and plating dissolution identification and fabrication adjustment processing 96.

Aspects of the present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In addition to the above, one or more aspects may be provided, offered, deployed, managed, serviced, etc. by a service provider who offers management of customer environments. For instance, the service provider can create, maintain, support, etc. computer code and/or a computer infrastructure that performs one or more aspects for one or more customers. In return, the service provider may receive payment from the customer under a subscription and/or fee agreement, as examples. Additionally or alternatively, the service provider may receive payment from the sale of advertising content to one or more third parties.

In one aspect, an application may be deployed for performing one or more embodiments. As one example, the deploying of an application comprises providing computer infrastructure operable to perform one or more embodiments.

As a further aspect, a computing infrastructure may be deployed comprising integrating computer readable code into a computing system, in which the code in combination with the computing system is capable of performing one or more embodiments.

As yet a further aspect, a process for integrating computing infrastructure comprising integrating computer readable code into a computer system may be provided. The computer system comprises a computer readable medium, in which the computer medium comprises one or more embodiments. The code in combination with the computer system is capable of performing one or more embodiments.

Although various embodiments are described above, these are only examples. For example, other types of devices and/or tracking components may be used in one or more embodiments. Many variations are possible.

Further, other types of computing environments can benefit and be used. As an example, a data processing system suitable for storing and/or executing program code is usable that includes at least two processors coupled directly or indirectly to memory elements through a system bus. The memory elements include, for instance, local memory employed during actual execution of the program code, bulk storage, and cache memory which provide temporary storage of at least some program code in order to reduce the number of times code must be retrieved from bulk storage during execution.

Input/Output or I/O devices (including, but not limited to, keyboards, displays, pointing devices, DASD, tape, CDs, DVDs, thumb drives and other memory media, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems, and Ethernet cards are just a few of the available types of network adapters.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method of facilitating fabricating a circuit board assembly, the method comprising:
controlling, by a controller, an automated soldering system applying solder to plated through-holes of a circuit board, and a time domain reflectance system to evaluate plating of a plated through-hole of the plated through-holes, the controlling comprising:
in situ characterizing plating of the plated through-hole of the circuit board using the time domain reflectance system to obtain a base reflectance measurement prior to applying solder to the plated through-hole via the automated soldering system;
applying solder to the plated through-hole using the automated soldering system;
based on applying the solder, re-characterizing the plating of the plated through-hole of the circuit board using the time domain reflectance system to obtain a new reflectance measurement; and
based on a deviation between the new reflectance measurement and the base reflectance measurement exceeding a threshold, identifying by the controller dissolution, at least in part, of the plating of the plated through-hole due to the applying of the solder; and
based on the identifying, by the controller, the dissolution, at least in part, of the plating of the plated through-hole due to the applying of the solder, terminating, by the controller, the automated soldering system from applying solder to one or more other plated through-holes of the circuit board.

2. The method of claim 1, wherein the plating comprises a plated conductive material, and the threshold is predetermined as a deviation value representative of dissolution, in part, of the plated conductive material of the plated through-hole based on applying the solder.

3. The method of claim 2, wherein the plated conductive material comprises copper.

4. The method of claim 1, wherein the characterizing comprises sending a first frequency pulse down the plating of the plated through-hole, and receiving a first reflectance response as the base reflectance measurement.

5. The method of claim 4, wherein the re-characterizing comprises sending a second frequency pulse down the plating of the plated through-hole, and receiving a second reflectance response as the new reflectance measurement.

6. The method of claim 1, wherein fabricating the circuit board assembly includes forming a pin-through-hole connection at the selected plated through-hole by:
inserting a conductive pin into the plated through-hole; and
applying the solder within the plated through-hole to electrically connect the conductive pin and the plated through-hole.

7. The method of claim 1, wherein the automated soldering system is an automated wave soldering system, and the terminating comprises terminating, by the controller, soldering of the circuit board by the automated wave soldering system.

8. A computer program product for facilitating fabricating a circuit board assembly, the computer program product comprising:
a non-transitory computer-readable storage medium having program instructions embodied therewith, the program instructions being executable by a processor to cause the processor to:
control, by a controller, an automated soldering system applying solder to plated through-holes of a circuit board, and a time domain reflectance system to evaluate plating of a plated through-hole of the plated through-holes, the control comprising:
in situ characterizing a plating of the plated through-hole of the circuit board using the time domain reflectance system to obtain a base reflectance measurement prior to applying solder to the plated through-hole via the automated soldering system;
applying solder to the plated through-hole using the automated soldering system;
based on applying the solder, re-characterizing the plating of the plated through-hole of the circuit board using the time domain reflectance system to obtain a new reflectance measurement; and
based on a deviation between the new reflectance measurement and the base reflectance measurement exceeding a threshold, identifying by the controller dissolution, at least in part, of the plating of the plated through-hole due to the applying of the solder; and
based on the identifying, by the controller, the dissolution, at least in part, of the plating of the plated through-hole due to the applying of the solder, terminating, by the controller, the automated soldering system from applying solder to one or more other plated through-holes of the circuit board.

9. The computer program product of claim 8, wherein the plating of the plated through-hole comprises copper, and the threshold is predetermined as a deviation value representative of dissolution, in part, of the plating of the plated through-hole based on applying the solder.

10. The computer program product of claim 8, wherein fabricating the circuit board assembly includes forming a pin-through-hole connection at the selected plated through-hole by:
inserting a conductive pin into the plated through-hole; and
applying the solder within the plated through-hole to electrically connect the conductive pin and the plated through-hole.

11. The computer program product of claim 8, wherein the automated soldering system is an automated wave soldering system, and the terminating comprises terminating, by the controller, soldering of the circuit board by the automated wave soldering system.

\* \* \* \* \*